United States Patent [19]

Matsui et al.

[11] 4,260,900

[45] Apr. 7, 1981

[54] CHARGE-TRANSFER IMAGE SENSOR

[75] Inventors: Kenichi Matsui, Ayase; Nobuo Suzuki, Kamakura, both of Japan

[73] Assignee: Tokyo Shibaura Denki Kabushiki Kaisha, Japan

[21] Appl. No.: 12,454

[22] Filed: Feb. 15, 1979

[30] Foreign Application Priority Data

Feb. 16, 1978 [JP] Japan .................................. 53-15876

[51] Int. Cl.$^3$ ............................................. H01J 40/14
[52] U.S. Cl. ..................................... 250/578; 357/32
[58] Field of Search ............... 250/578, 211 J; 357/24, 357/29, 30, 31, 32; 307/221 D; 358/212, 213

[56] References Cited

U.S. PATENT DOCUMENTS

| 4,012,587 | 3/1977 | Ochi et al. | 250/211 J |
| 4,045,817 | 8/1977 | Nakatani et al. | 250/578 |
| 4,145,721 | 3/1979 | Beaudouin et al. | 357/30 |

OTHER PUBLICATIONS

"Video Processing in Charge-Transfer Image Sensors by Recycling of Signals Through the Sensor", P. K. Weimer et al., RCA Review, vol. 35, pp. 341-354, Sep. 1974.

"Design and Operation of Floating Gate Amplifier", D. D. Wen IEEE Jour. of Solid State Circuits, vol. SC-9, pp. 410-414.

*Primary Examiner*—David C. Nelms
*Attorney, Agent, or Firm*—Finnegan, Henderson, Farabow, Garrett & Dunner

[57] ABSTRACT

A charge-transfer image sensor comprises a photosensitive section for receiving a light signal to produce a charge packet corresponding to the intensity of the light signal, a readout shift register for reading out the charge packet for transfer, an output detecting section for storing the charge packet read out of the readout shift register and detecting it, an output conversion circuit for producing an output voltage signal corresponding to the amount of charge of the packet, and a storing shift register for holding charge packets transferred from the output detecting section.

8 Claims, 6 Drawing Figures

F I G. 1
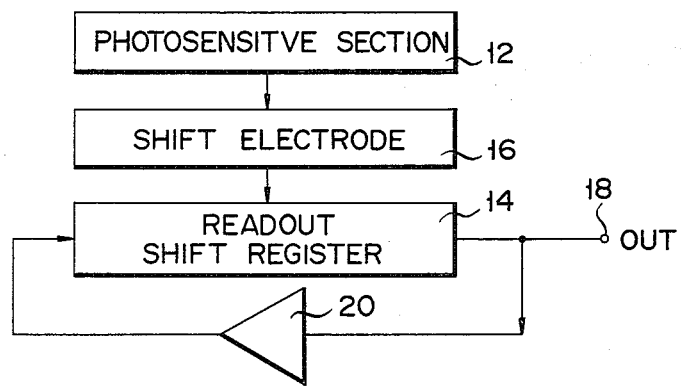
F I G. 2
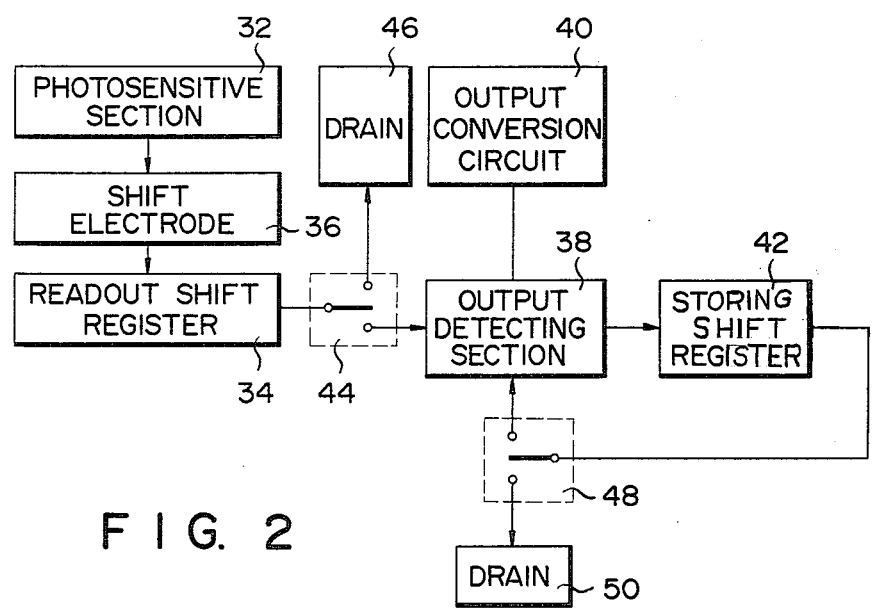

CHARGE-TRANSFER IMAGE SENSOR

BACKGROUND OF THE INVENTION

This invention relates to a charge-transfer image sensor.

Widely utilized is a charge-transfer image sensor comprised of a semiconductor integrated circuit.

FIG. 1 schematically shows an example of a conventional image sensor. Reference numeral 12 shows a photosensitive section formed on the surface of a semiconductor substrate, not shown. The photosensitive section receives an external light signal to produce a charge packet. The charge packet is read onto a readout shift register 14 for transferring charge packets. A shift electrode 16 receives a proper external voltage pulse signal to control a transfer of charge packets from the photosensitive section 12 to the readout shift register 14. An output voltage signal of the readout shift register 14 is taken out from its output terminal OUT 18 and fed back through an amplifier 20 to the input side of the shift register 14 for subsequent readout. The output voltage signal is taken out a required number of times through a closed loop including the readout shift register and amplifier 20. The output voltage signal is obtained each time it is circulated once in the closed loop. At the output section of the readout shift register the charge packet is converted to a voltage signal and at the input section of the readout shift register the voltage signal is converted to the charge packet. In this case, however, the conversion efficiency at the input and output sections of the readout shift register 14 is not actually ideal. For this reason, an output signal is deviated from its original one for each circulation in the closed loop. In consequence, the output signal will include a greater error as the readout of the same signal is repeated. It has therefore been difficult to process highly accurate signals.

SUMMARY OF THE INVENTION

One object of this invention is to provide a charge-transfer image sensor which can repeatedly readout a substantially error-free signal.

Another object of this invention is to provide a charge-transfer image sensor which can erase a signal after it is read out a required number of times.

According to this invention there is provided a charge-transfer image sensor comprising a photosensitive section for receiving a light signal to produce a charge packet corresponding to the intensity of the light signal, a readout shift register for reading out the charge packet for transfer, output detecting means for storing the charge packet read out of the readout shift register and detecting the amount of charge of the packet, an output conversion circuit for delivering an output voltage signal corresponding to the amount of charge of packet from the output detecting means and a storing shift register for holding charge packets from the output detecting means.

BRIEF DESCRIPTION OF THE DRAWING

FIG. 1 is a block diagram schematically showing an arrangement of a conventional charge-transfer image sensor;

FIG. 2 is a block diagram showing a fundamental arrangement of a charge-transfer image sensor according to one embodiment of this invention;

PREFERRED EMBODIMENT OF THE INVENTION

Figure 3:
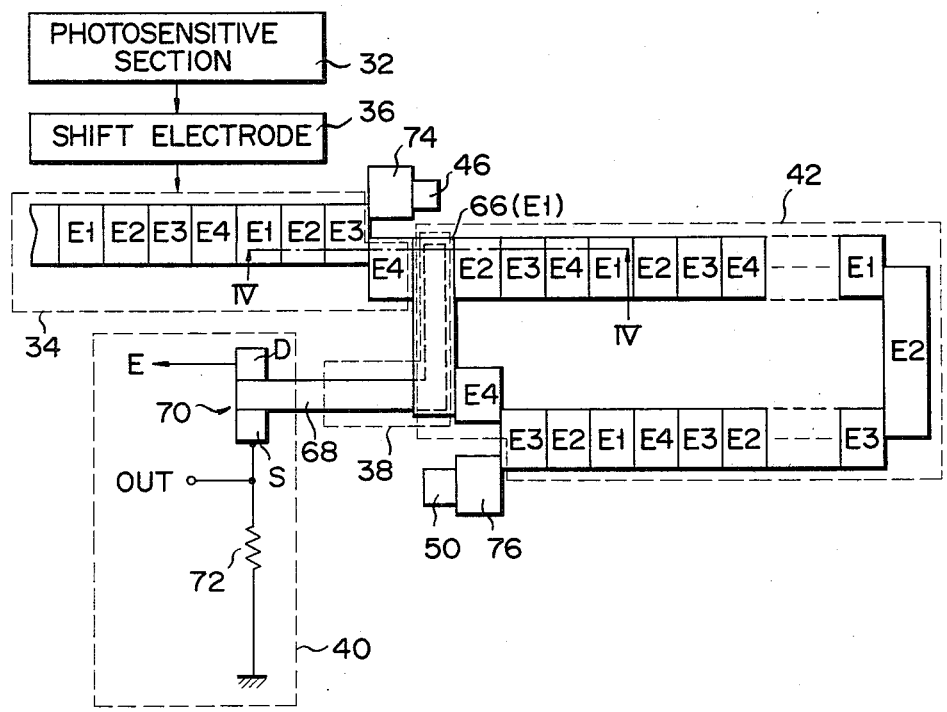
FIG. 3 shows a detailed arrangement of the charge-transfer image sensor of FIG. 2.

FIG. 2 is a schematic diagram showing a fundamental arrangement of a charge-transfer image sensor according to one embodiment of this invention. All the block components of the image sensor of FIG. 2 are formed on a single semiconductor substrate to provide an IC circuit. A reference numeral 32 shows a photosensitive section which receives a light signal corresponding to an image to produce a charge packet corresponding to the intensity of the light signal. The charge packet on the photosensitive section 32 is read out to a readout shift register 34. A shift electrode 36 receives a control pulse signal of proper magnitude in proper timing to permit the charge packet on the photosensitive section 32 to be transferred to the readout shift register 34. An output detecting section 38 stores the charge packet transferred from the readout shift register 34 for detection and receives a control signal in proper timing from the outside to cause the charge packet to be transferred to a storing shift register 42. An output conversion circuit 40 delivers a voltage signal corresponding to the charge packet detected at the output detecting section 38. A switch 44, when supplied with a proper control signal from the outside, permits the charge packet on the readout shift register 34 to be supplied to the output detecting section 38 or to a drain 46. A switch 48, when supplied with a control pulse signal from the outside, permits the charge packet to be supplied from the storing shift register 42 to the output detecting section 38 or to a drain 50. The readout shift register 34 and storing shift register 42 are comprised of charge coupled devices. The charge coupled devices of these shift registers are designed to have the same number of stages and the same number of phases for each stage. In the embodiment of FIG. 2 and embodiments to be set out later, various control pulse signals are applied to various components of the image sensor, but the corresponding signal sources are omitted for brevity's sake. A control pulse signal receiving terminal is also omitted.

The operation of the image sensor will now be explained below by reference to FIG. 2.

The photosensitive section 32, when received from a light signal from the outside, produces a charge packet corresponding to the intensity of the light signal. The charge packet is transferred in proper timing to the readout shift register 34. The transfer of the charge packet from the photosensitive section 32 to the readout shift register 34 is controlled by a control pulse signal which is applied from the outside. The switches 44 and 48 are controlled by a proper control signal from the outside to provide two modes as set out below. With the switch 44 closed on the side of the output detecting section 38 and the switch 48 closed on the side of the drain 50 charge packets of the readout shift register 34 are transferred through the output detecting section 38 to the storing shift register 42 and thence to the drain 50 where it is drained. This is a transfer mode. With the switch 44 closed on the side of the drain 46 and the switch 48 closed on the side of an output detecting section 38 the charge packet from the readout shift register 34 is drained through the drain 46 and the charge packet stored in the storing shift register 42 is circulated through the output detecting section 38. This is a circulation mode. When in either mode the charge packet passes through the output detecting section 38 it is detected there and a voltage signal corresponding to the charge packet is taken out at the output conversion circuit 40. Since, in the circulation mode, the circulated charge packet is not converted to voltage signal no error occurs at the conversion time and thus an output signal substantially free from errors can be repeatedly obtained. If a proper combination of the transfer mode and circulation mode is used by controlling the switches 44 and 48 in proper way, an output signal substantially free from errors can be repeatedly obtained and at the same time an unrequired charge packet can be eliminated.

Figure 4:
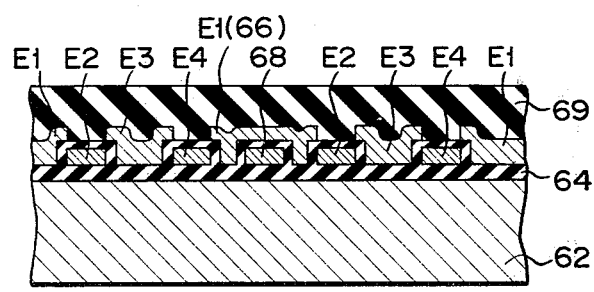
FIG. 4 is a cross-sectional view, as taken along line IV—IV, showing part of the image sensor of FIG. 3.

FIG. 3 shows a detail of the arrangement of the image sensor as shown in FIG. 2. FIG. 4 is a cross-sectional view, taken along line IV—IV in FIG. 3, showing part of the image sensor of FIG. 3. In this embodiment the readout shift register 34 and storing shift register 42 are each constructed of an equal number of stages of 4-phase charge-coupled devices. E1, E2, E3 and E4 show first, second, third and fourth electrodes, respectively. The electrodes E1, E2, E3 and E4 are arranged on an oxide film 64, such as an $SiO_2$ film 64, as shown in FIG. 4, which overlies a semiconductor substrate 62 of, for example, silicon. The output detecting section 38 comprises a first phase electrode (E1) 66 at the first state of the storing shift register 42 and a floating electrode 68 (see FIG. 4) which is disposed below the first phase electrode 66 and surrounded by the insulating film 64 for electrical insulation. In FIG. 4, reference numeral 69 shows an $SiO_2$ film (insulating film) for protection which is formed usually by a CVD (Chemical Vapor Deposition) method. The output conversion circuit 40 is comprised of a source-follower type circuit comprising a MOS transistor having a floating electrode as a gate electrode and a drain D to which a voltage E is applied and a resistor 72 connected between the source of the MOS transistor 70 and a reference potential point such as a ground point. The electrode 74 is a control electrode adapted to receive a control signal from the outside to permit charge packets read out from the readout shift register 34 to selectively flow into the drain 46. The control electrode 74 corresponds to the switch 44 of FIG. 2. Likewise, the electrode 76 is a control electrode adapted to receive a proper control signal to permit charge packets to selectively flow into the drain 50 and it corresponds to the switch 48 of FIG. 2.

The operation of the image sensor will now be described below.

The photosensitive section 32, when supplied with a light signal from the outside, produces a charge packet corresponding to the intensity of the light signal. The charge packet is transferred under the control of the shift electrode 36 to the readout shift register 34. Drive pulses having a mutually slight phase difference are applied from the outside to the corresponding phase electrodes E1, E2, E3 and E4 of the readout shift register 34. A drive pulse generating source is omitted. Charge packets are sequentially transferred from the phase electrode E1 up to the phase electrode E4.

Now suppose that a channel-OFF level voltage signal allowing the charge packet to flow into the drain 46 is applied to the control electrode 74 and that a channel-ON level voltage signal is applied to the control electrode 74. That is, suppose that the image sensor is set in a transfer mode. In this case, charge packets stored in the readout register 34 are transferred to the control electrode 66 (the first phase electrode E1) of the output detecting section 38, because the channel to the drain 46 is cut off. When the charge packet is transferred to the control electrode 66 the potential of the floating electrode varies dependent upon the amount of charge of the packet. That is, the drain electrode of a MOS transistor 70 constituting part of an output conversion circuit varies and thus a current corresponding to such variation will flow through the MOS transistor 70 and load resistor 72. At this time a voltage drop occurs across the load resistor and is taken out as an output voltage signal from the terminal OUT. A potential on the floating gate 68 varies when the charge packet is transferred to the control electrode 66. Then, charge packets are sequentially transferred to the phase electrodes E2, E3 and E4 in the first stage of the storing shift register. Then, the charge packet is sequentially transferred to the phase electrodes E1, E2, E3 and E4 in the second stage of the storing shift register 42 until it is transferred up to the phase electrode E4 in the final stage of the storing shift register. On the other hand, those charge packets previously stored in the phase electrodes E1, E2, . . . in the storing shift register 42 are sequentially drained through the drain 50. In this way, the charge packet from the readout shift register 34 is transferred through the control electrode 66 to the storing shift register 42.

Suppose that a channel-ON level voltage signal is applied to the control electrode 74 and a channel-OFF level voltage signal is applied to the control electrode 76. That is, suppose that the image sensor is set in a circulation mode. In this case, the charge packet transferred from the readout shift register 34 is drained through the drain 46. Charge packets stored in the storing shift register 42 are sequentially transferred to the phase electrodes E1, E2, E3, E4, E1, E2, . . . in the storing shift register 42. That is, the charge packet is circulated in a circulation loop including the storing shift register 42 and the control electrode 66 in the output detecting section 38. In the circulation mode, an output voltage signal is taken out in the same way as in the transfer mode. Each time the charge packet is transferred to the control electrode of the output detecting section a potential on the floating electrode 68 varies dependent upon the amount of charge of the packet. Such a potential variation is read, as a voltage signal, out of the output conversion circuit 40. Even if an output signal is repeatedly extracted by circulating the charge packets in the storing shift register 42, a highly accurate output signal can be obtained, because the charge packet is circulated without being converted to a voltage signal.

Figure 5:
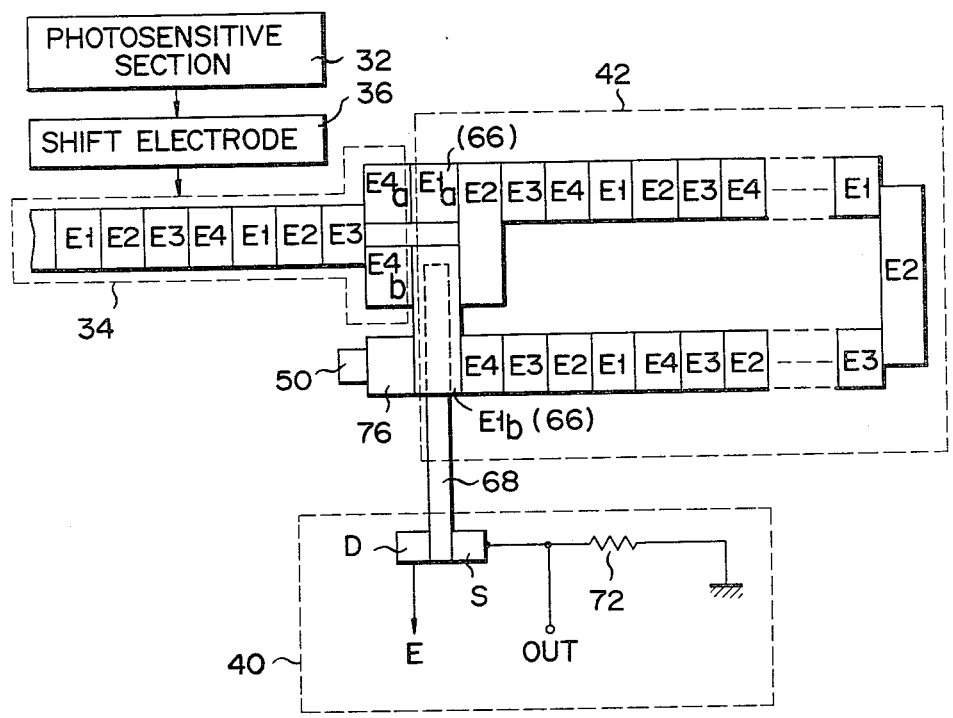
FIG. 5 is a view showing a charge-transfer image sensor according to another embodiment of this invention.

FIG. 5 shows a charge-transfer image sensor according to another embodiment of this invention. In this embodiment the same reference numeral is employed to designate those parts or elements corresponding to those of the embodiment of FIG. 3. In the embodiment of FIG. 5 a set of transfer electrodes E4a, E1a are arranged between the readout shift register 34 and the storing shift register 42. The fourth phase electrode in the final stage of the readout shift register is divided into first and second parts E4a and E4b and the first phase electrode E1 in the first stage of the storing shift register 42 is divided into first and second parts E1a and E1b. A floating gate 68 is formed not below the electrode E1a, but only below the electrode E1b. Suppose that a channel-ON level signal is applied to the electrode part E4b and a channel-OFF level signal is applied to the electrode part E4a of the fourth phase electrode and control electrode 76. In this case, charge packets of the readout shift register 34 are transferred to the part E1b of the control electrode 66 through the part E4b of the fourth phase electrode and then sequentially transferred to the phase electrodes E2, E3, E4, E1, . . . . When the charge packet is transferred to the part E1b of the control electrode E1b the potential on the floating electrode 68 varies dependent upon the amount of charge of the packet and such a potential variation is taken, as an output voltage signal, out of an output conversion circuit 40. The output voltage signal is processed at a suitable signal processing system (not shown) and judgement is made as to whether it is a desired signal or not. When the output signal is a desired signal, the supply of a channel-ON level voltage signal to the part E4b of the fourth phase electrode is cut off and at the same time a channel-ON level voltage signal is supplied to the part E4a of the fourth phase electrode and control electrode 76. Charge packets corresponding to N bits which have been transferred to the storing shift register 42 are sequentially transferred to the respective phase electrodes of the storing shift register. When the charge packet is transferred to the control electrode E1b of the control electrode 66, an output voltage signal is taken out of the output conversion circuit 40. The charge packet is drained from the drain 50 through the part E1b of the control electrode 66 and control electrode 76. Charge packets corresponding to N+1 bits et seq. are sequentially transferred from the readout shift register 36 through the part E4a of the fourth electrode to the storing shift register 42. In this case, the transfer of the charge packet to the storing shift register 42 is continued from the time at which the supply of the voltage signal to the part E4b of the fourth phase electrode is cut off while at the same time a voltage signal is applied to the part E4b of the fourth phase electrode and control electrode 76. The charge packets are sequentially transferred to the respective phase electrodes in the storing shift register 42. When the charge packet is transferred to the part E1b of the control electrode 66 the potential on the floating gate 68 varies dependent upon the amount of charge of the packet. Such a potential variation is taken, as an output voltage signal, out of the output conversion circuit 40. Then, the charge packet flows into the drain 50 through the part E1b of the control electrode 66 and control electrode 76. When an output voltage signal corresponding to the first N-bit charge packets from the readout shift register 34 is judged as not being a desired signal, a channel-ON level voltage signal is applied to the control electrode 76. While a voltage signal is being supplied to the part E4b of the fourth phase electrode. The part E4a of the fourth phase electrode is held in such a stage that voltage signal is not applied thereto. In this case, those charge packets transferred from the readout shift register 34 to the storing shift register 42 and those charge packets transferred in the storing shift register 42 are all flowed into the drain 50 through the part E1b of the control electrode 66. In the image sensor as shown in FIG. 5 judgement is made as to whether the charge packet is a desired signal or not. This judgement is made using the first N-bit charge packets which are read out of the readout shift register 34. Those charge packets corresponding to N bits and the charge packets corresponding to N+1 et seq. can be taken out of the same output circuit.

Figure 6:
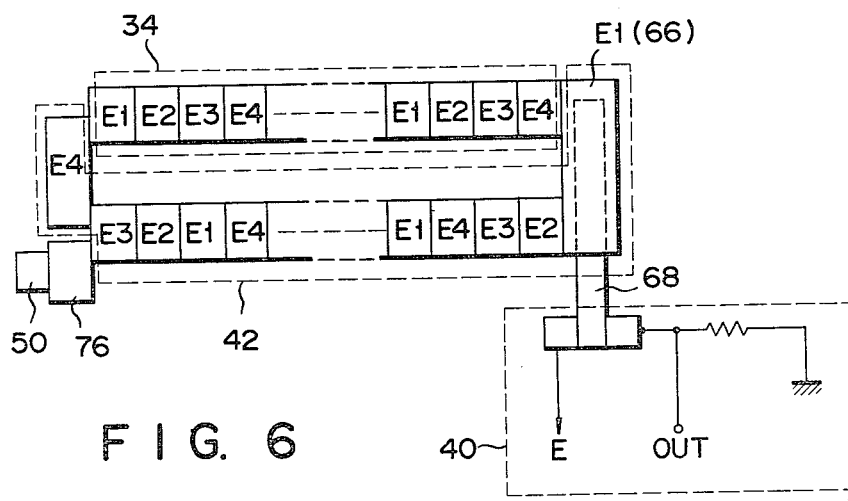
FIG. 6 is a view showing a charge-transfer image sensor according to another embodiment of this invention.

FIG. 6 shows an image sensor according to another embodiment of this invention. In this embodiment the same reference numerals are employed to designate parts or elements corresponding to those shown in FIGS. 3 and 5. An explanation of the arrangement of FIG. 6 is therefore omitted. A photosensitive section 32 and shift electrode 36 are omitted. In this embodiment, when a channel is erased the image sensor is set in a circulation mode and charge packets transferred from a readout shift register 34 through a control electrode 66 (E1) to a storing shift register 42 are again transferred into the readout shift register 34. When the charge packet is transferred to the control electrode 66 the potential on the floating gate varies dependent upon the amount of charge of the packet. Such a potential variation is taken, as an output voltage signal, out of the output conversion circuit 40. An output signal can be taken out a necessary number of times by repeatedly circulating the charge packet in a circulation ring including the readout shift register 34, control electrode 66 and storing shift register 42.

In this embodiment an output signal substantially free from errors can be repeatedly obtained, since the corresponding charge packet is circulated without being converted to a voltage signal. Suppose that a channel-ON level voltage signal 76 is applied to the control electrode 76. In this case, the image sensor is set in the erase mode and the charge packet transferred through the readout shift register 34 and storing shift register 42 is drained through the drain 50.

Although in the above-mentioned embodiments the readout shift register 34 and storing shift register 42 are all constructed of four-stage charge-coupled devices, this invention is not restricted thereto. These registers 34 and 42 may be constructed of charge-coupled devices of any other number of stage such as a single-stage, two stage, three stage, five or more stage.

Furthermore, the image sensor of this invention may be applied to a one-dimensional type or a two-dimensional type. Although the source follower type circuit is shown as an output conversion circuit, any other conversion circuits may of course be used.

What we claim is:
1. A charge-transfer image sensor including a semiconductor substrate, comprising
 (a) photosensitive means for receiving a light signal to produce a charge packet corresponding to the intensity of the light signal;
 (b) a readout shift register for reading out charge packets;
 (c) output detecting means for storing the charge packet transferred from said readout shift register and detecting the amount of charge of the packet;
 (d) an output conversion circuit for producing an output voltage signal corresponding to the amount of charge of the packet detected at said output detecting means;
 (e) a storing shift register for storing the charge packets transferred from said output detecting means and permitting the charge packet to be circulated therein; and (f) drain means for draining the charge packet transferred from the storing shift register.

2. A charge-transfer image sensor according to claim 1 further including signal transfer means arranged between the readout shift register and the storing shift register such that it provides an additional signal transfer path.

3. A charge-transfer image sensor according to claim 1 in which said readout shift register, said output detecting means and said storing shift register provides a closed loop to permit charge packets to be circulated therein.

4. A charge-transfer image sensor according to claim 1 in which said readout shift register is comprised of charge-coupled devices the same in number as those of said storing shift register.

5. A charge-transfer image sensor according to claim 4 which is a single-stage type.

6. A charge-transfer image sensor according to claim 4 which is a multiple-stage type.

7. A charge-transfer image sensor according to claim 1 in which said output detecting means comprises a certain phase electrode of said storing shift register and a floating gate on which a potential varies dependent upon the amount of charge of the packet stored in said phase electrode.

8. A charge-transfer image sensor according to claim 1 in which said output conversion means comprises a transistor of which the gate potential varies dependent upon the amount of charge of the packet detected by said output detecting means, resistor means connected between the source electrode of said transistor and a reference potential point, and output means for taking out a voltage drop across said resistor.

* * * * *